United States Patent [19]
Tsai et al.

[11] Patent Number: 5,818,850
[45] Date of Patent: Oct. 6, 1998

[54] SPEED COVERAGE TOOL AND METHOD

[75] Inventors: Li Ching Tsai; Floyd E. Moore; Protik Mia; Karsten Guthridge, all of Ft. Collins, Colo.

[73] Assignee: Hewlett-Packard Company, Palo Alto, Calif.

[21] Appl. No.: 773,714

[22] Filed: Dec. 20, 1996

[51] Int. Cl.$^6$ ........................................... G06F 11/00
[52] U.S. Cl. ............................................. 371/27.4
[58] Field of Search ................... 371/27.4, 22.1, 371/22.5, 22.6, 25.1, 27.1, 27.7

[56] References Cited

U.S. PATENT DOCUMENTS

| | | | |
|---|---|---|---|
| 5,475,624 | 12/1995 | West | 371/25.1 |
| 5,657,241 | 8/1997 | Butts et al. | 364/489 |

*Primary Examiner*—Vincent P. Canney

[57] ABSTRACT

A test coverage tool determines the adequacy of a set of test vectors for a state simulator for exercising logic paths in a logic circuit design. The speed coverage tool generally compares state data from a state simulator and timing data from a timing simulator in order to validate whether a test vector covers a simulated timing path. In architecture, the speed coverage tool includes first logic configured to acquire state data from the logic circuit design that has been produced by a state simulator based upon test vectors. Second logic associated with the tool obtains timing data concerning one or more logic paths of the logic circuit design that has been produced using a timing simulator. Third logic associated with the test coverage tool is configured to determine a transition score by comparing the timing data with the state data. The score is indicative of the adequacy of a set of test vectors. Another feature of the test coverage tool involves analysis of sensitization data, or logic state information regarding internal nodes that should be set to particular logic states in order to enable particular logic paths. A sensitization score can be produced to indicate the extent to which sensitization data matches. Analysis of the sensitization data by the test coverage tool results in more accurate analysis and assessment of coverage.

21 Claims, 5 Drawing Sheets

SPEED COVERAGE TOOL AND METHOD

FIELD OF THE INVENTION

The present invention generally relates to simulation systems that analyze integrated circuit designs, and more particularly, to a speed coverage tool and method for determining the adequacy of test vectors exercising logic paths in a logic circuit design.

BACKGROUND OF THE INVENTION

During the development of integrated circuits, particularly large scale integrated circuits (ICs), various software tools are utilized to check and test the operation and functionality of logic paths of the ICs. Two software tools that are commonly utilized are a state simulator and a timing simulator.

The state simulator is software that emulates a logic circuit, such as an IC. One or more test vectors are input into the state simulator in order to produce logical results. The results are analyzed to determine whether or not the logic circuitry performs the desired logic functions. A test vector is essentially a set of logic states that are imposed upon corresponding nodes in the logic circuitry. A set of test vectors typically makes up each test. The vectors are fed into the logic circuit design sequentially, usually one vector per clock phase. Stated in other words, when the clock transitions to a logic high, a test vector is fed to the state simulator; when the clock transitions to a logic low, the next vector is fed to the state simulator; and so on. For a set of test vectors, the state simulator indicates what state (either logic low, or "0", or logic high, or "1") that each node will exhibit during each phase after each test vector is applied. The state simulator produces state data, which is essentially a large matrix of logic values for nodes in a circuit, referenced to each phase transition, or time step, as determined by the state simulator.

A timing simulator is software that determines timing information for each logic path. In general, it measures the time that it takes for signals to propagate through the circuit elements by providing the times at which each input signal arrives at each node in a path relative to a clock. Paths are usually scored in order of speed so that a designer can find ways to speed up a slow path and thus enable a higher frequency of operation. The timing data that is output by the timing simulator includes a list of paths, typically ordered slow to fast, with the time that each transition occurred at each node for each path.

Critical paths are the slowest paths in a circuit design. If a designer wishes to increase the speed of the circuit, the designer needs to speed up the transistors and/or wires that are in the critical paths. The timing simulator is a useful tool in identifying the critical paths.

Other software tools are available in the industry for collecting node toggle (transition) information, "stuck at" information, and delay fault information. These tools focus on process defects, typically one fault at a time. At present, there are no tools available for testing and accessing speed test coverage, or stated in other words, determining the extent to which test vectors exercise, or cover, logic paths in a logic circuit design.

SUMMARY OF THE INVENTION

The present invention is a test coverage tool and method for determining the adequacy of test vectors for a state simulator for exercising logic paths in a logic circuit design. The speed coverage tool and method generally compare state data from a state simulator and timing data from a timing simulator in order to validate whether a set of test vectors cover a simulated timing path.

In architecture, the speed coverage tool includes first logic configured to acquire state data from the logic circuit design that has been produced by a state simulator based upon test vectors. Second logic associated with the tool obtains timing data concerning one or more logic paths of the logic circuit design that has been produced using a timing simulator. Third logic associated with the test coverage tool is configured to determine a transition score by comparing the timing data with the state data. The transition score is indicative of the adequacy of the test vectors.

Another feature of the test coverage tool involves analysis of sensitization data, or logic state information regarding internal nodes that should be set to particular logic states in order to enable particular logic paths. A sensitization score can be produced to indicate the extent to which sensitization data matches. Inclusion of the sensitization data by the test coverage tool results in more accurate analysis and assessment of coverage.

The invention can also be viewed as a method for determining the adequacy of test vectors for exercising timing paths in a logic circuit design. In this regard, the method can be broadly conceptualized by the following steps: acquiring state data from the logic circuit design with a state simulator based upon one or more test vectors; obtaining timing data concerning at least one logic path of the logic circuit design with a timing simulator; and determining a score for each test vector by comparing the timing data with the state data, the score being indicative of the adequacy of the respective set of test vectors.

The invention has numerous advantages, a few of which are delineated hereafter, as merely examples.

An advantage of the invention is that it satisfies an industry need for a system for performing speed path coverage.

Another advantage of the invention is that it provides a tool for more critically analyzing simulation data, particularly data from both a state simulator and a timing simulator.

Another advantage of the invention is that it is compatible with a unix-based pipe and does not have large storage requirements.

Another advantage of the invention is that multiple logic paths can be verified in one pass through the state data.

Another advantage of the invention is that reports can be generated that show partial matches between test vectors and logic paths.

Another advantage of the invention is that sensitization data is checked and analyzed, leading to a more accurate assessment of test vectors.

Another advantage of the invention is that it supports latch-to-latch, pad-to-pad, pad-to-latch, and latch-to-pad paths.

Another advantage of the invention is that it can be used by IC designers and engineers to develop better tests for integrated circuit designs. The invention provides hints on how to modify an existing test in order to completely cover a timing path.

Another advantage of the invention is that is can be implemented in software and executed on any general purpose computer.

Another advantage of the invention is that it is simple in design and reliable in operation.

Other objects, features, and advantages of the present invention will become apparent to one with skill in the art upon examination of the following drawings and detailed description. It is intended that all such additional objects, features, and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating principles of the present invention. In the drawings, like reference numerals designate corresponding parts throughout the several views.

DETAILED DESCRIPTION OF THE PREFERRED EMBODIMENT

The speed coverage tool of the invention can be implemented in software, hardware, or a combination thereof. When implemented in software, the speed coverage tool can be stored on any computer readable medium for use by or in connection with any computer related system or method. In the context of this document, a computer readable medium is an electronic, magnetic, optical, or other physical device or means that can contain or store a computer program for use by or in connection with a computer related system or method.

Figure 1:
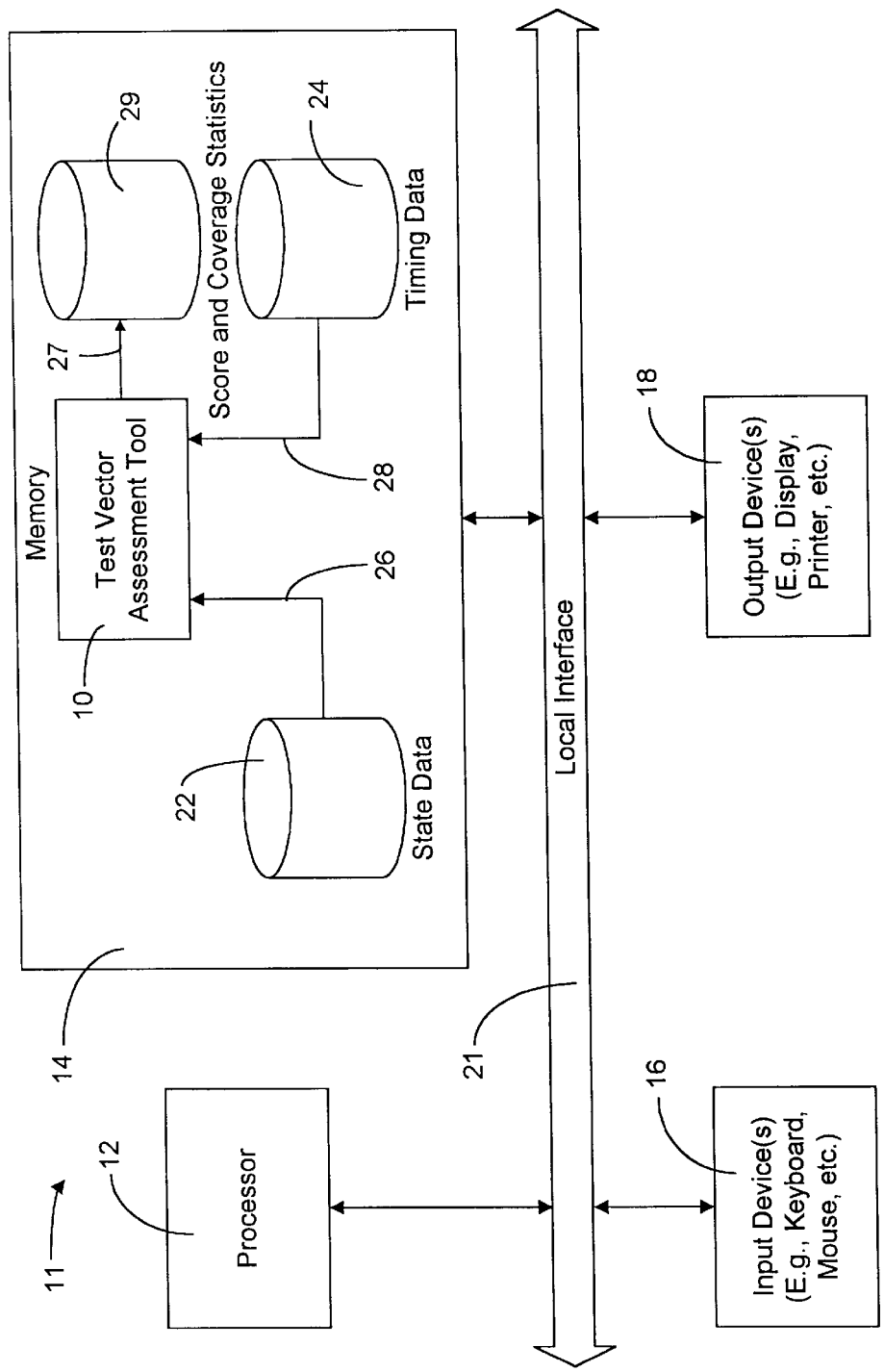
FIG. 1 is an electronic block diagram of an example of a computer having the speed coverage tool of the invention.

In the preferred embodiment, the speed coverage tool is implemented in software and executed by a general purpose computer, an example of which is shown in FIG. 1. In FIG. 1, the speed coverage tool is generally denoted by reference numeral 10. In terms of architecture, the computer 11 includes a processor 12 configured to execute software within a memory 14, including volatile (e.g., system memory in the form of random access memory (RAM)) and nonvolatile memory elements, and to generally control operations of the computer 11, one or more input devices 16 (e.g., keyboard, mouse, etc.) for providing inputs, one or more output devices 18 (e.g., display, printer, etc.) for providing computer outputs, and a local interface 21, such as one or more buses, for permitting communication among the aforementioned elements. The speed coverage tool 10 of the invention is stored within the memory 14 and executed by the processor 12. The speed coverage tool 10 is designed to receive and analyze state data 22 from a state simulator (not shown for simplicity) and timing data 24 from a timing simulator (not shown for simplicity), as indicated by respective reference arrows 26, 28, in order to produce score and coverage statistics 32. The score/statistics 32 indicate the extent to which a test vector of the state simulator has covered a logic path based upon timing information concerning the logic path from the timing simulator.

Figure 2:
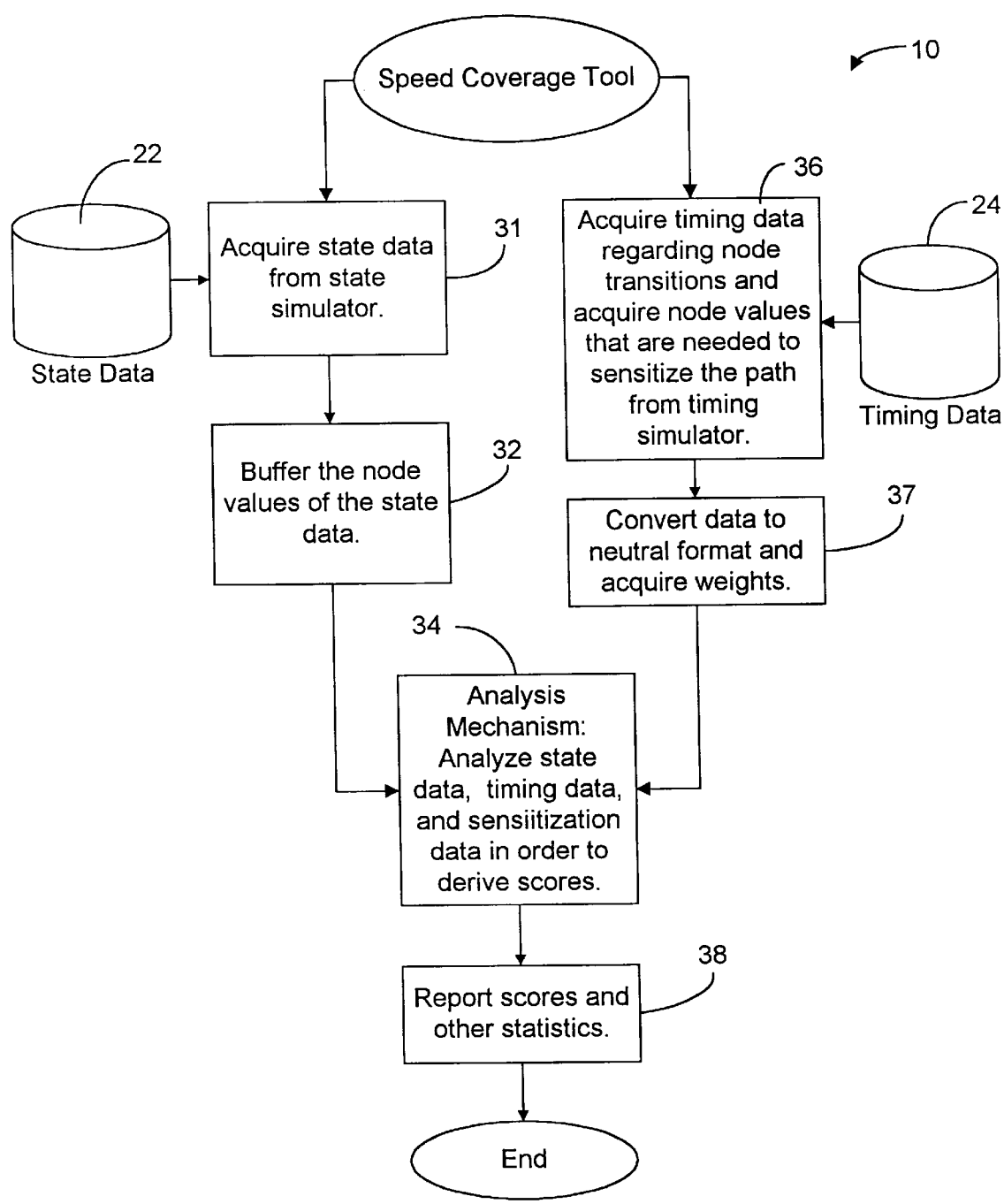
FIG. 2 is a flow chart showing the architecture and functionality of the speed coverage tool of FIG. 1.

FIG. 2 shows a flow chart of an example of a possible architecture for the speed coverage tool 10. The speed coverage tool 10 is configured to acquire and analyze the state data 22 and the timing data 24, as indicated hereafter. Note that each flow chart block of the drawings represents a segment, block, or module of software code, and hence, each flow chart defines the high level architecture, functionality, and operation of the underlying software code.

Block 31 acquires the state data 22 that is stored in the memory 14 (FIG. 1) and that was produced by the state simulator. The state data includes the logic state of each node and the clock at each time step, each time step defined by commencement and termination of each clock phase. After the state data has been acquired from the memory 14, block 31 transfers to block 32.

At block 32, the node values of the state data are extracted from the state data. In the preferred embodiment, the buffer 32 is configured to parse out and capture only significant nodes for performance reasons. The significant nodes are input to the speed coverage tool 10 by a user using any suitable software-based and/or hardware-based user interface. Block 32 transfers to block 33.

Block 36 is configured to acquire the timing data 24 from the memory 14 (FIG. 1) pertaining to one or more paths. Timing data includes for each path includes the following: [a] one or more node identities; [b] whether each node exhibited a rise or a fall; and [c] the time of the rise/fall transition relative to a clock. From the time information, a phase is determined. In essence, the foregoing information indicates the speed of a path and does not indicate whether the path is valid.

Block 36 is also configured to acquire sensitization data, which is generally information indicating particular states that internal nodes should be initialized to, or set to, in order to isolate particular logic paths. The sensitization information can be generated by the timing simulator or input by a user of the computer 11. After the timing and sensitization data have been obtained, block 36 transfers to block 37.

Block 37 converts the timing data into a neutral format to enable, among other things, easy comparison with the state data. In this step, optionally but preferably, the sensitization data is merged with the timing data and weights are assigned to nodes. In the preferred embodiment, a user can assign weights, between 0 and 9, inclusive, in order of increasing importance, to nodes depending upon the degree of interest in the particular node. For instance, a "don't care" node can be given a "0", while a node to be given full weight is accorded a "9". Zeroing out nodes is generally used in debugging. As an example of a node that may be given a weight of "0", consider the scenario where node names in an IC design have changed. In this event, block 34 will not be able to match a node which has different names in the state and timing data, in which case, these nodes can be given a weight of "0". Another example of a node that may be accorded a "0" weight is a node associated with a data stimulus, which will change depending upon the inputs. An example of a node that may be accorded a weight of "9" is a node directly in a critical data path. The weights can be assigned by the user using any suitable software-based and/or hardware-based user interface that communicates with the block 37. This weight assignment feature enhances the performance of the speed coverage tool 10. The operations of this step will be better understood after review of a discussion of an operational example near the end of the detailed description section herein.

An analysis mechanism 34 is configured to receive the state data from the block 33 and the timing data pertaining to one or more paths from the block 37. The analysis mechanism 34 analyzes the state data, the timing data, and the sensitization data in order to derive the score/statistics 29 (FIG. 1). In general, the analysis mechanism 34 determines whether each test vector has exercised nodes of a path in the same order as the nodes were exercised in the timing simulation. Stated in other words, the analysis mechanism 34 looks for information that indicates whether the state simulator has executed nodes pursuant to a test vector in the same order as the timing simulator has executed the nodes. Block 34 transfers to block 38.

Figure 3:
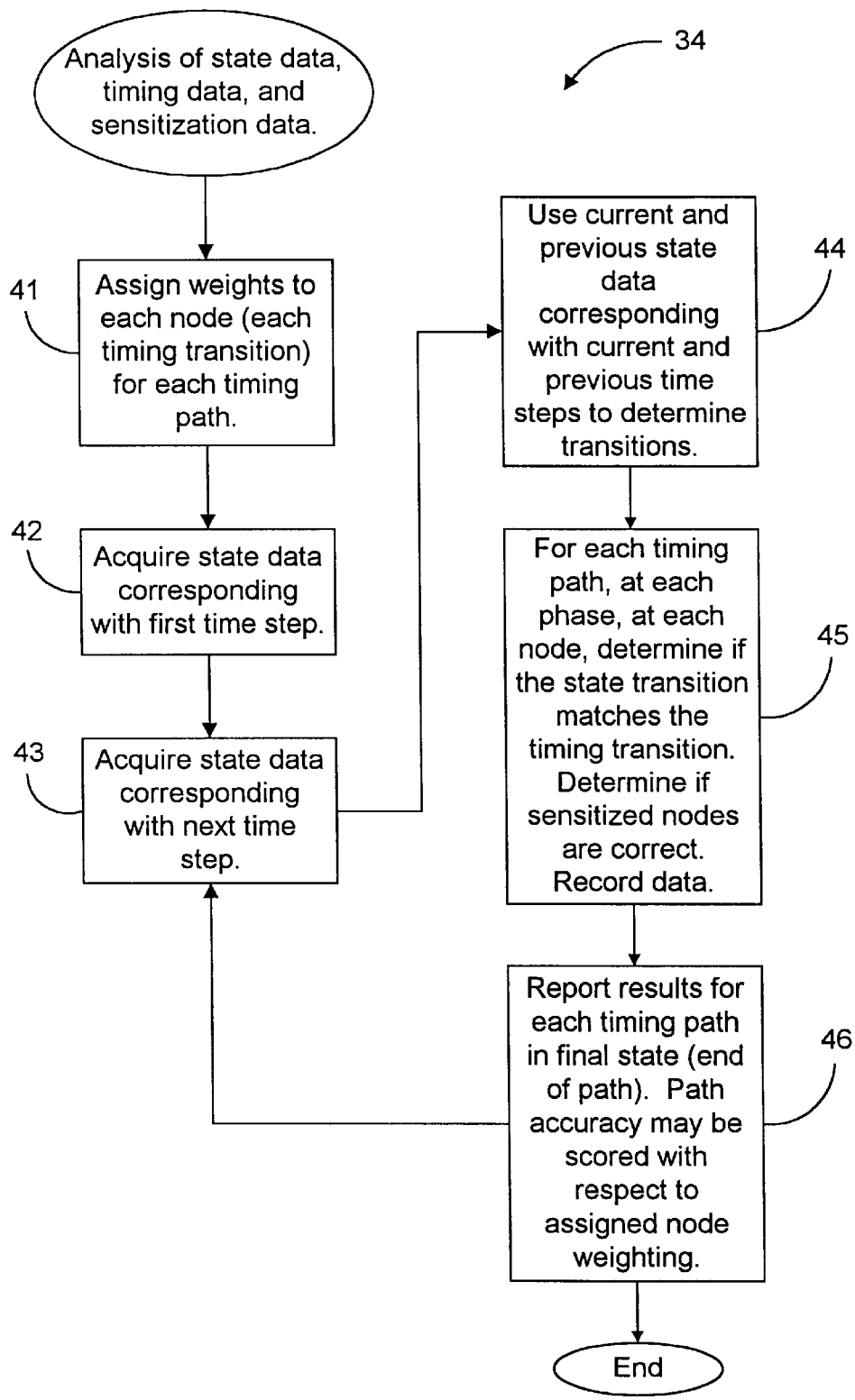
FIG. 3 is a flow chart showing the architecture and functionality of the analysis mechanism of FIG. 2.

FIG. 3 is a flow chart illustrating the architecture and functionality of an example of the analysis mechanism 34 (FIG. 2). Referring to FIG. 3, the analysis mechanism 34 includes a block 41, which is configured to retrieve the weights that were assigned to each node of the path at issue.

Block 42 executes after block 41. Block 42 acquires state data corresponding with a time step. Block 42 transfers to block 43.

Block 43 is configured to acquire another set of state data corresponding with the next time step. Block 43 transfers to block 44.

At block 44, the current and previous state data sets are compared and analyzed to determine rise/fall transitions for each node in the path. Block 44 transfers to block 45.

Block 45 determines to what extent state transitions in the state data match the state transitions in each path of the timing data. In a sense, block 45 looks for a path signature in the state data for each timing simulation path. The determination is made for each timing simulation path, at each phase, at each node. Furthermore, the block 45 is configured to determine if the sensitized nodes are correct. After the foregoing information is computed, the data is recorded by block 45, for later reporting, if desired. Block 45 transfers to block 46.

Block 46 is configured to report the results for each timing simulation path. The path accuracy may be scored, and if weights have been assigned by block 41, then the score is computed pursuant to the weights. Block 46 transfers to block 43, which obtains another set of state data for analysis and the foregoing process continues, until each state data set for each time step has been analyzed.

After all state data sets have been analyzed, block 46 transfers to block 38 of FIG. 2, which is configured to generate a report having the score/statistics 29 regarding how well the test vectors exercised paths defined by the timing simulations. In the preferred embodiment, two scores are calculated, one for the path nodes and the other for the sensitization nodes. The former is referred to as the "transition score" and is computed by considering the states and weights of the path nodes, and the latter is referred to as the "sensitization score" and is computed by considering the states and weights of the sensitization nodes. Each of the aforementioned scores may be computed separately, for example, as follows:

$$\text{score} = \{[(n_1)(w_1) + \ldots + (n_i)(w_i)]/(w_1) + \ldots + (w_i)\} * 100\%$$

where n is 1 if the logic transition of the node matches and is 0 if the logic transition of the node does not match, and w is the weight assigned to the node. This first methodology is utilized in the preferred embodiment.

As another example, a second methodology that may be employed to compute the scores is as follows:

$$\text{score} = \{[(n_1)(w_1) + \ldots + (n_i)(w_i)]/[(\text{number of nodes in path}) * 9]\} * 100\%$$

As yet another example, a third methodology that may be employed to calculate the respective scores is as follows:

$$\text{score} = [(\text{not } n_1)(w_1) + \ldots + (\text{not } n_i)(w_i)]/9$$

In this example, the score is effectively computed by using a "missed node" counter.

A report disclosing the scores can be forwarded by block 38 to any suitable output device 18 (FIG. 1), including for example, a display, printer, etc.

EXAMPLE

For purposes of clarifying the invention, a specific example will be described hereafter.

Figure 4:
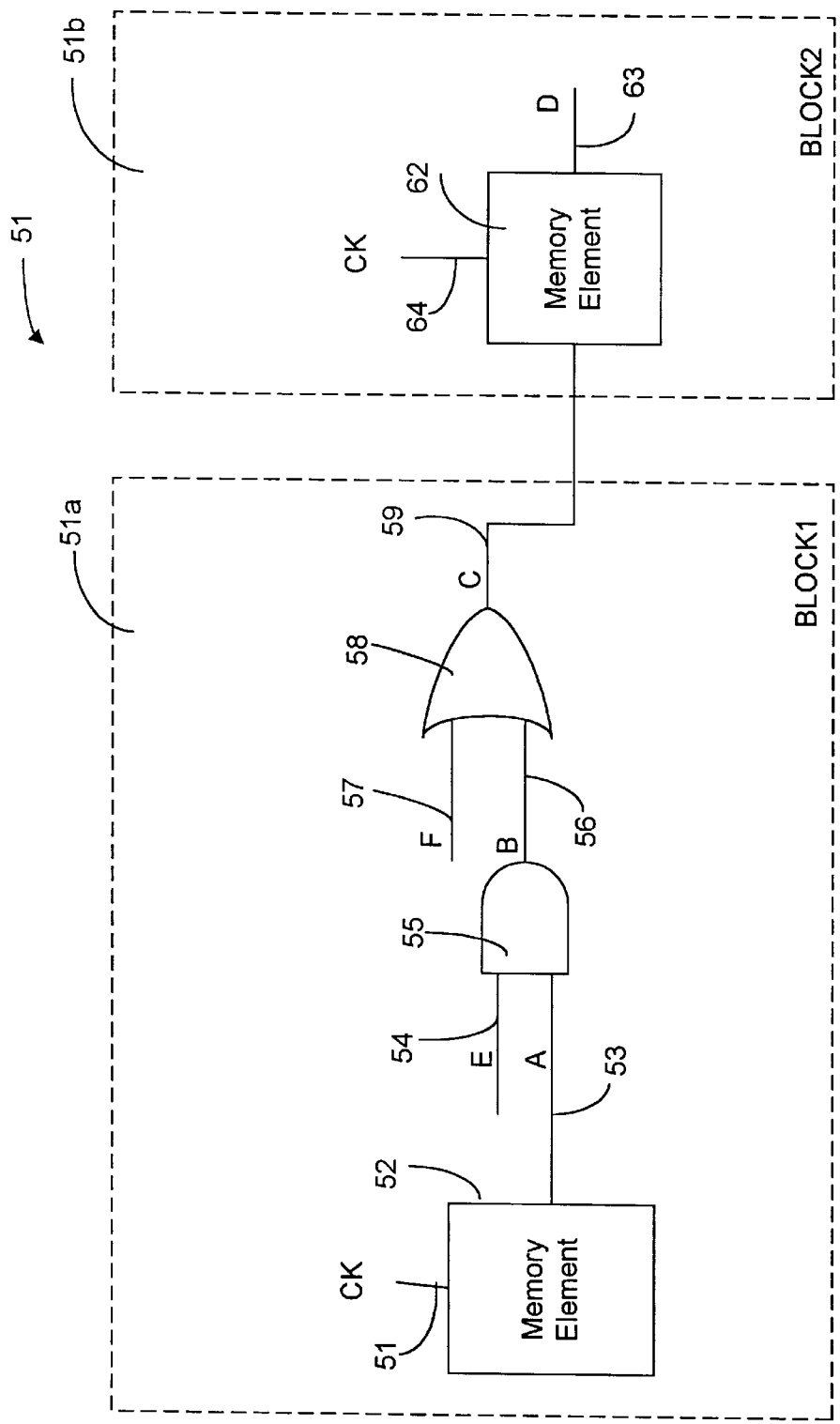
FIG. 4 is an electronic block diagram of an example of a logic path in a logic circuit design that can be analyzed by the speed coverage tool of FIG. 1.

First, it is assumed that a logic circuit design 51, as illustrated in FIG. 4, is sought to be analyzed by the state simulator and the timing simulator, and then subsequently, the speed coverage tool 10 of the invention is utilized to analyze the results of the foregoing simulators. Thus, the speed coverage tool 10 determines to what extent one or more test vectors for the state simulator exercise nodes in a path of the logic circuit design 51 of FIG. 4, the path being identified by the timing simulator.

The logic circuit design 51 comprises two logic blocks 51a, 51b (BLOCK1, Block2, respectively). Assume that the nodes of the path that is at issue in this example are nodes A, B, C, and D, denoted by respective reference numerals 53, 56, 59, and 63. Referring to FIG. 4, a memory element 52 that resides in logic block 51a (BLOCK1) releases data on even phases of the clock CK. The memory element 52 forwards data to an AND logic gate 55 via a connection 53. The AND logic gate 55 also receives an input 54 (node E). An OR logic gate 58 receives the output 56 from the AND logic gate 55 as well as an input 57 (node F).

A memory element 62 situated in the logic block 51b (Block2) receives the output 59 from the OR logic gate 58 and produces data on connection 63 on odd phases of clock CK. Data is gathered on even phases by the memory element 62.

In this example, the speed coverage tool 10 of the present invention operates as follows. First, state data and timing data are obtained pursuant to corresponding blocks 31, 36 (FIG. 2). An example of state data and timing data, which could be derived from the logic circuit design 51 (FIG. 4), are shown in FIG. 5 for purposes of discussion and are denoted by respective reference numerals 47, 48.

Figure 5:
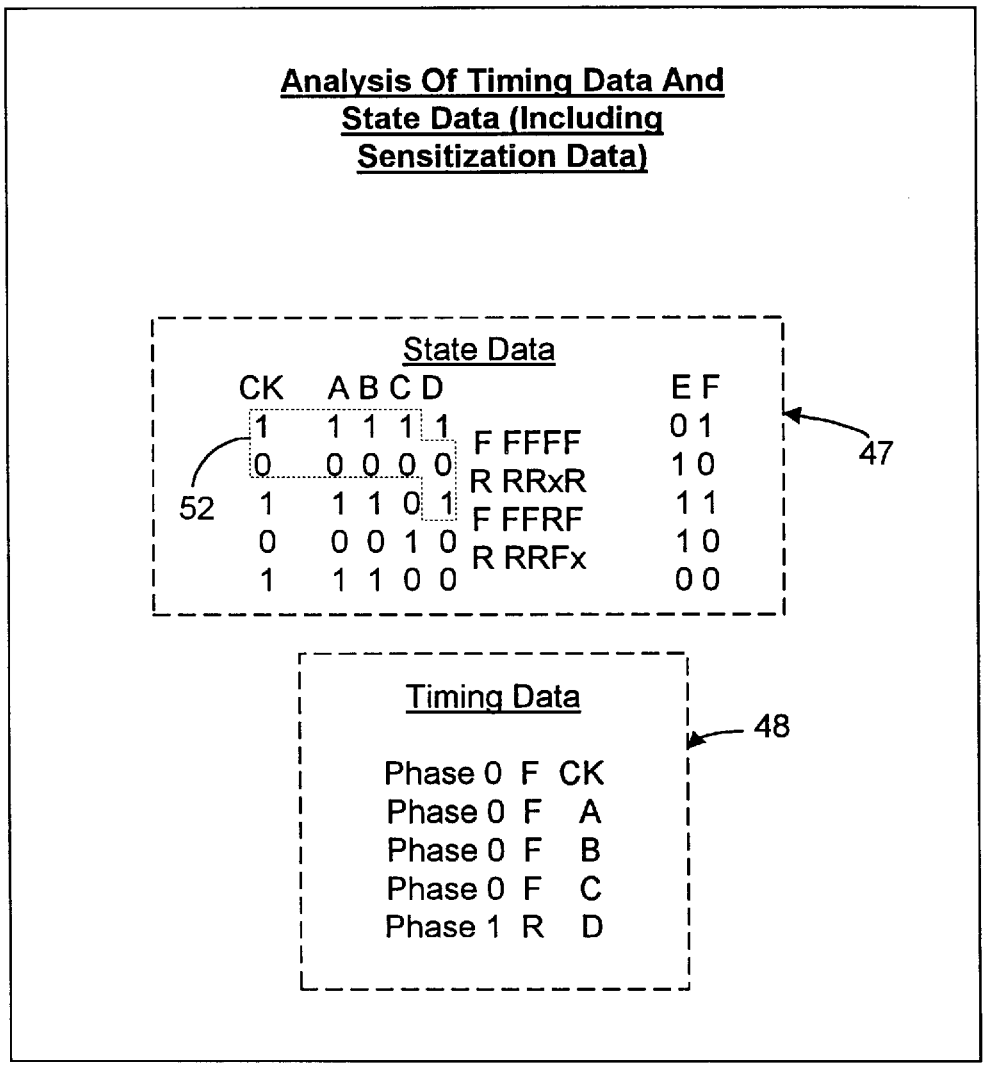
FIG. 5 is a schematic diagram for clarifying the comparison of timing data and state data, as performed by the analysis mechanism of FIG. 3.

As shown in FIG. 5, in the state data 47, each column is allocated to a node and indicates the logic states of the respective node. The first column indicates the logic states of the clock CK and the columns that follow show the logic states corresponding with the other nodes, including the nodes A, B, C, D of the path and the sensitization nodes E, F. Each row essentially represents the logic states of the respective nodes at a particular time step.

In the timing data 48, the first column indicates the identify of the phase. The second column indicates the nature of the transition, i.e., whether the node rose [R] or fell [F]. The third column indicates the node identity.

The analysis mechanism 34 compares the state data with the timing data in order to determine the score/statistics 29. The analysis mechanism 34 will attempt to match the timing path with the transitions of the state data at every time step $t_i$. There may be multiple instances of matching, in which case the timing path has been exercised in multiple instances by the test vectors.

The state data is buffered by block 32 (FIG. 2), and the timing data is converted to a neutral format by block 37 (FIG. 2). Assume that at block 37, the following weights are assigned to nodes A through F, respectively: 2, 3, 4, 5, 6, 7.

The state data and timing data are next forwarded to the analysis mechanism 34 for comparison. In accordance with block 42 (FIG. 3), the state "1111110" at time step to is acquired. Next, block 43 (FIG. 3) acquires the next state "0000011" at time step $t_2$. Block 44 (FIG. 3) compares the foregoing states in order to determine rise/fall transitions. In this case, block 44 will determine "FFFFF" corresponding with path nodes CK, A, B, C, D, respectively. Block 44 transfers to block 45 (FIG. 3).

For purposes of computing the transition score, block 45 compares "FFFFF" of the state data with "FFFFR" of the timing data to determine to what extent the transitions match and records the results. Afterward, block 45 transfers to block 46.

Block 46 computes the transition score as follows based upon the records regarding transition matches between the state and timing data:

transition score=(1)(2)+(1)(3)+(1)(4)+(1) (5)+(0)(6)]/(2+3+4+5+6)=70%

Further, the nodes E and F were to exhibit a 1 and 0, respectively, based upon the logic of circuit design 51. At the present time step $t_1$, they do match. Accordingly, block 46 calculates the sensitization score as follows, using the first score computation methodology, as described previously:

sensitization score=[(1)(1)+(1)(1)]/(1+1)=100%

Block 46 (FIG. 3) reports the score/statistics 29 (FIG. 1).

In this case, pursuant to this example, block 46 transfers back to block 43, which obtains another state "1110111" for nodes CK, A, B, C, D, E, F, respectively, at time step $t_2$. Next, the nonsensitization node transitions are determined at block 44 as "RRRxR". Block 44 transfers to block 45.

Block 45 determines to what extent the transitions of the state data correspond with the transitions of the timing data and records the results. Block 45 transfers to block 46.

Block 46 will conclude that the timing simulation path has been matched with the state data, because CK, A, B, C fell during one time phase (between time steps $t_0$ and $t_1$) and node D rose during the next clock phase (between time steps $t_1$ and $t_2$). This scenario is highlighted in FIG. 5 via phantom block 52. Block 52 represents the timing simulation path defined by the timing data.

In this example, because all timing path nodes CK, A, B, C, D matched the state data, the transition score will be computed as 100%. Further, the nodes E and F were to exhibit a 1 and 0, respectively, based upon the logic of circuit design 51. However, in this time step, nodes E and F exhibit 1 and 1, respectively, in which case the sensitization node F exhibits an improper state. In this case, the sensitization score is computed as 46% as follows:

sensitization score=.{(1)(6)+(0)(7)}/(6+7)=46%

Block 46 transfers back to block 43, which acquires another state "0001010" at the time step $t_3$. Block 44 determines the transitions for the path nodes as "FFFRF." Block 45 concludes that there are no matches between the state data and timing data and records this information. Block 45 transfers to block 46., which produces a transition score of 0%, as follows:

transition score=(0)(2)+(0)(3)+(0)(4)+(0)(5)+(0)(6)]/(2+3+4+5+6)=0%

Further, the nodes E and F were to exhibit a 1 and 0, respectively, based upon the logic of circuit design 51. At the present time step t3, they do match. Accordingly, block 46 calculates the sensitization score as follows:

sensitization score=[(1)(1)+(1)(1)]/(1+1)=100%

Next, block 46 (FIG. 3) reports the score/statistics 29 (FIG. 1).

Block 46 transfers back to block 43, which acquires another state "1110000" at the time step $t_4$. Block 44 determines the transitions for the path nodes as "RRRFx." Block 45 determines the matches between the state data and timing data and records this information. Block 45 transfers to block 46, which produces a transition score of 64%, as follows:

transition score=(1)(2)+(1)(3)+(1)(4)+(0)(5)]/ (2+3+4+5)=64%

Further, the nodes E and F were to exhibit a 1 and 0, respectively, based upon the logic of circuit design 51. At the present time step $t_4$, node E does not match. Accordingly, block 46 calculates the sensitization score as 50% as follows:

sensitization score=[(0)(1)+(1)(1)]/(1+1)=50%

Next, block 46 (FIG. 3) reports the score/statistics 29 (FIG. 1).

Many variations and modifications may be made to the preferred embodiment of the invention as described previously. All such modifications and variations are intended to be included herein within the scope of the present invention, as is defined by the following claims.

Furthermore, in the claims hereafter, the structures, materials, acts, and equivalents of all "means" elements, "logic" elements, and steps are intended to include any structures, materials, or acts for performing the functions specified in connection with said elements.

Therefore, the following is claimed:

1. A method for determining the adequacy of test vectors for exercising timing paths in a logic circuit, comprising the steps of:

acquiring state data from said logic circuit with a state simulator based upon said test vectors;

obtaining timing data concerning at least one logic path of said logic circuit with a timing simulator; and determining a transition score by comparing said timing data with said state data, said score being indicative of said adequacy of said test vectors.

2. The method of claim 1, further comprising the step of determining for a particular timing path an indicator as to which nodes matched with said state data.

3. The method of claim 1, further comprising the steps of:

acquiring sensitization data from said timing simulator; and comparing said sensitization data with said state data to determine a sensitization score.

4. The method of claim 1, further comprising the steps of:

parsing out a set of significant nodes from said state data prior to said comparing of said timing data with said state data; and determining said transition score based upon said significant nodes.

5. The method of claim 3, further comprising the steps of:

parsing out a set of significant nodes from said state data prior to said comparing of said timing data with said state data; and determining said transition and said sensitization scores based upon said significant nodes.

6. A method for determining the adequacy of test vectors for exercising timing paths in a logic circuit, comprising the steps of:

acquiring state data from said logic circuit with a state simulator based upon said test vectors;

obtaining timing data concerning at least one logic path of said logic circuit with a timing simulator, said timing data including first transition data;

computing second transition data from said state data; and determining a score by comparing said first and second transition data, said score being indicative of said adequacy of said test vectors.

7. The method of claim 6, further comprising the step of determining for a particular timing path an indicator as to which nodes matched with said state data.

8. The method of claim 6, further comprising the steps of:

acquiring sensitization data from said timing simulator; and comparing said sensitization data with said state data to determine a sensitization score.

9. The method of claim 6, further comprising the steps of:

parsing out a set of significant nodes from said state data prior to said comparing of said timing data with said state data; and determining said transition score based upon said significant nodes.

10. The method of claim 8, further comprising the steps of:

parsing out a set of significant nodes from said state data prior to said comparing of said timing data with said state data; and determining said transition and said sensitization scores based upon said significant nodes.

11. A computer readable medium having a program for determining the adequacy of test vectors for input to a state simulator for analyzing logic paths in a logic circuit, the program comprising:

first logic configured to receive state data concerning said logic circuit and generated by a state simulator based upon said test vectors;

second logic configured to receive timing data concerning at least one logic path of said logic circuit and generated by a timing simulator; and third logic configured to determine a transition score by comparing said timing data and said state data, said transition score being indicative of said adequacy of said test vectors.

12. The medium of claim 11, disposed in a computer system and interfaced with a computer processor.

13. The medium of claim 11, disposed in a portable storage apparatus.

14. The medium of claim 11, wherein said third logic is configured to determine, for a particular logic path, an indicator as to which nodes matched between said first and second transition data.

15. The medium of claim 11, further comprising:

logic configured to acquire sensitization data; and logic configured to determine a sensitization score based upon said sensitization data and said state data.

16. The medium of claim 11, further comprising:

logic configured to parse out critical nodes from said state data prior to said comparing of said timing data and said state data; and logic configured to determine said score based upon said critical nodes and said timing data.

17. The medium of claim 15, further comprising:

logic configured to produce a set of significant nodes from said state data prior to said comparing of said timing data with said state data, said significant nodes being lesser in number than those nodes represented in said state data; and logic configured to determine said transition and said sensitization scores based upon said significant nodes.

18. A system for determining the adequacy of test vectors for input to a state simulator for analyzing logic paths in a logic circuit, comprising:

first logic configured to receive state data concerning said logic circuit and generated by a state simulator based upon said test vectors;

second logic configured to receive timing data concerning at least one logic path of said logic circuit and generated by a timing simulator; and third logic configured to determine a transition score by comparing said timing data and said state data, said score being indicative of said adequacy of said test vectors.

19. The system of claim 18, further comprising:

logic configured to acquire sensitization data; and logic configured to determine a sensitization score based upon said sensitization data and said state data.

20. The system of claim 18, further comprising:

logic configured to produce a set of nodes from said state data prior to said comparing of said timing data and said state data, said set of nodes being lesser in number than those nodes represented in said state data; and logic configured to determine said score based upon said critical nodes and said timing data.

21. The system of claim 19, further comprising:

logic configured to produce a set of nodes from said state data prior to said comparing of said timing data with said state data, said set of nodes being lesser in number than those nodes represented in said state data; and logic configured to determine said transition and said sensitization scores based upon said significant nodes.

* * * * *